(12) United States Patent
Holesinger et al.

(10) Patent No.: US 6,624,122 B1
(45) Date of Patent: *Sep. 23, 2003

(54) HIGH CRITICAL CURRENT SUPERCONDUCTING TAPES

(75) Inventors: Terry G. Holesinger, Los Alamos, NM (US); Quanxi Jia, Los Alamos, NM (US); Stephen R. Foltyn, Los Alamos, NM (US)

(73) Assignee: The Regents of the University of California, Los Alamos, NM (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/870,579

(22) Filed: May 30, 2001

Related U.S. Application Data
(60) Provisional application No. 60/213,111, filed on Jun. 21, 2000.

(51) Int. Cl.$^7$ .................... H01L 39/00; H01F 6/00; H01B 12/00
(52) U.S. Cl. .................... 505/105; 505/106; 505/234; 505/238; 505/779; 428/701; 428/702
(58) Field of Search .................... 505/125, 126, 505/230, 234, 237, 238, 779, 809; 428/699, 701, 702, 130

(56) References Cited

U.S. PATENT DOCUMENTS

| 4,983,570 | A | * | 1/1991 | Creuzet et al. ............... 427/62 |
|---|---|---|---|---|
| 5,071,828 | A | * | 12/1991 | Greuter et al. ............... 427/189 |
| 5,106,823 | A | * | 4/1992 | Creuzet et al. ............... 257/33 |
| 5,364,836 | A | * | 11/1994 | Dynes et al. ............... 257/31 |
| 5,374,610 | A | * | 12/1994 | Fukushima et al. ......... 428/930 |
| 5,523,284 | A | | 6/1996 | Fagan, Jr. et al. .......... 505/501 |
| 5,525,584 | A | * | 6/1996 | Murakami et al. ........ 252/519.1 |
| 5,529,980 | A | * | 6/1996 | Gupta ........................ 428/688 |
| 5,612,292 | A | * | 3/1997 | Gupta ........................ 427/419.3 |
| 5,627,139 | A | * | 5/1997 | Chin et al. ..................... 257/33 |
| 5,793,092 | A | * | 8/1998 | Habermeier et al. .......... 257/22 |
| 5,869,431 | A | * | 2/1999 | Veal et al. ..................... 427/62 |
| 5,898,020 | A | * | 4/1999 | Goyal et al. ................. 148/320 |
| 5,958,599 | A | * | 9/1999 | Goyal et al. ................. 428/457 |
| 5,968,877 | A | * | 10/1999 | Budai et al. ................... 117/86 |
| 6,114,758 | A | * | 9/2000 | Anderson et al. ........... 257/685 |
| 6,157,044 | A | * | 12/2000 | Nakanishi et al. ............. 257/31 |
| 6,188,919 | B1 | * | 2/2001 | LaGraff et al. ................ 257/31 |
| 6,204,139 | B1 | * | 3/2001 | Liu et al. ..................... 438/385 |
| 6,383,989 | B2 | * | 5/2002 | Jia et al. ..................... 505/235 |

OTHER PUBLICATIONS

Saitoh et al., "Microstructures and superconducting properties of melt–processed (RE, RE'''–Ba–Cu–O," Physica C 288 (1997), pp. 141–147.*

Matthews et al., "Melt–textured growth and characterisation of (Nd/Y)Ba2Cu3O7–beta composite superconductor with very high critical desnity," Physica C 249 (1945), pp. 255–261.*

Schatzle et al., "Melt–processing of (Nd,Y)BaCuO and (SM,Y)BaCuO composites," Supercond. Sci. Technol. 9 (1996), pp. 869–874.*

Foltyn et al., "Pulsed Laser Deposition of Thick $YB_aCu_3O_7-\delta$ Film with $J_c \geq 1$ $MA/cm^2$," Appl. Phys. Lett. 63 (13), 27, pp. 1848–1850, Sep. 27, 1993.

* cited by examiner

Primary Examiner—Tom Dunn
Assistant Examiner—Colleen P. Cooke
(74) Attorney, Agent, or Firm—Bruce H. Cottrell

(57) ABSTRACT

Improvements in critical current capacity for superconducting film structures are disclosed and include the use of a superconducting RE-BCO layer including a mixture of rare earth metals, e.g., yttrium and europium, where the ratio of yttrium to europium in the RE-BCO layer ranges from about 3 to 1 to from about 1.5 to 1.

10 Claims, 3 Drawing Sheets

HIGH CRITICAL CURRENT SUPERCONDUCTING TAPES

The present invention claims the benefit of provisional patent application Serial No. 60/213,111, filed on Jun. 21, 2000.

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to composite structures for achieving high critical current densities in superconductive film tapes. Such composite structures can be a high critical current superconductive tape including a mixture of rare earth metal barium copper oxide compositions. Such composite structures can also be a multilayer structure for high critical current superconductive tapes where individual layers are formed in situ from a single mixture of rare earth metal barium copper oxide compositions.

BACKGROUND OF THE INVENTION

Since their initial development, coated conductor research has focused on fabricating increasing lengths of the material, while increasing the overall critical current carrying capacity. Different research groups have developed several techniques of fabricating coated conductors. Regardless of which techniques are used for the coated conductors, the goal of obtaining highly textured superconducting thick films, such as $YBa_2Cu_3O_{7-x}$ (YBCO), with high supercurrent carrying capability on metal substrates remains. The use of thick superconducting films for coated conductors appears logical because both the total critical current and the engineering critical current density (defined as the ratio of total critical current and the cross-sectional area of the tape) are directly correlated with the thickness of the superconducting films.

It has been known for some time that the critical current density of a YBCO film is a function of film thickness for films on either single crystal wafers or polycrystalline nickelbased alloy substrates. A higher critical current density is achieved at a YBCO film thickness in the range of about 100 to about 400 nanometers (nm). On the other hand, critical current density tends to decrease with increasing YBCO film thickness. For example, Foltyn et al., Appl. Phys. Lett., 63, 1848–1850, 1993, demonstrated that critical current density saturates to a value of around 1 megaampere per square centimeter ($MA/cm^2$) for YBCO films having a thickness beyond 2 micrometers ($\mu$m) on single crystal substrates. Critical current density is lower for YBCO on polycrystalline metal substrates, mainly due to less superior in-plane texture of the YBCO films. The challenge is that adding more YBCO material beyond about 2 $\mu$m using normal processing conditions on metal substrates does not contribute to the overall supercurrent carrying capability. This suggests that the supercurrent in such thick YBCO films on metal substrates is not uniformly distributed throughout the film thickness. It is now believed that a high defect density present in the top region of a thick YBCO film results in such a problem.

Despite the recent progress in production of superconductive tapes, continued improvements remain desirable in the magnitude of critical current properties.

It is an object of the present invention to provide superconducting tapes having high critical current values, i.e., greater than about 1 mega-ampere (M-amp).

It is another object of the present invention to provide superconducting tapes having high critical current values by use of a layer including a mixture of, e.g., YBCO and a second superconducting material such as EuBCO and the like, such mixtures having an optimal ratio for high critical current values.

It is yet another object of the present invention to provide multilayer superconducting tapes having alternating layers of, e.g., different rare earth metal barium copper oxide compositions where such a multilayer structure is formed in situ from a single mixture of at least two rare earth-barium-copper-oxide compositions.

SUMMARY OF THE INVENTION

To achieve the foregoing and other objects, and in accordance with the purposes of the present invention, as embodied and broadly described herein, the present invention provides a superconducting structure including a substrate and a film composed of a mixture of at least two superconducting rare-earth-barium-copper oxides thereon the substrate, said film from about 0.5 micron to at least about 4 microns in thickness and including a ratio of a first rare earth metal of yttrium to a second rare earth metal of from about 3 to 1 to from about 1.5 to 1, the film characterized as having a critical current for the film including the mixture of rare-earth metals greater than a critical current for any single rare-earth metal containing superconducting rare-earth-barium-copper oxide layer of about the same thickness alone.

The present invention further provides a multilayer superconducting structure including a substrate and alternating layers of a first rare-earth-barium-copper oxide and a second rare-earth-barium-copper oxide, said multilayer superconducting structure formed in-situ by deposition of a single mixture of said first rare-earth-barium-copper oxide and said second rare-earth-barium-copper oxide followed by annealing under a high partial pressure oxygen atmosphere.

The present invention further provides a superconducting structure including a substrate, a film of a superconducting rare-earth-barium-copper oxide upon the substrate, the film comprising a composite multilayer structure of a first layer of a mixture of superconducting rare-earth-barium-copper oxides from about 0.2 microns to about 2 microns in thickness, a layer of an insulating material selected from the group consisting of cerium oxide, strontium titanate, yttrium oxide, magnesium oxide, and yttria-stabilized zirconia, or of a conducting material such as lanthanum strontium cobalt oxide and strontium ruthenium oxide, and a second layer of a mixture of superconducting rare-earth-barium-copper oxides from about 0.2 microns to about 2 microns in thickness, the superconducting structure characterized as having a total combined thickness of superconducting rare-earth-barium-copper oxide layers of at least 2 microns and characterized as having a critical current for the composite multilayer structure greater than a critical current for a single mixed superconducting rare-earth-barium-copper oxide layer of about the same thickness, the single mixed superconducting rare-earth-barium-copper oxide layer including the same rare-earth metals as the composite multilayer structure.

DETAILED DESCRIPTION

Figure 1:
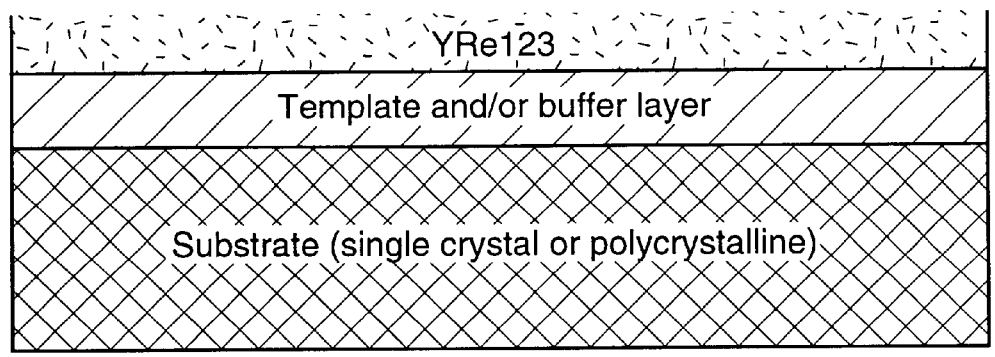
FIG. 1 shows a generic structure of a composite Y(RE)BCO film in accordance with an embodiment of the present invention.

The present invention is concerned with high temperature superconducting wire or tape and the use of high temperature superconducting films to form such wire or tape. In the present invention, the superconducting material generally includes YBCO, e.g., $YBa_2Cu_3O_{7-\delta}$, $Y_2Ba_4Cu_7O_{14+x}$, or $YBa_2Cu_4O_8$, although other minor variations of this basic superconducting material may also be used. $YBa_2Cu_3O_{7-\delta}$ is preferred as one component of the superconducting material mixture. Other superconducting materials such as bismuth and thallium based superconductor materials may also be employed.

In one embodiment of the present invention, a superconducting structure is formed including a substrate and a film composed of a mixture of at least two superconducting rare-earth-barium-copper oxides upon the substrate. The rare earth metals can generally be any suitable rare earth metal from the periodic table, but are preferably chosen from among yttrium, neodymium, samarium, europium, gadolinium, erbium and ytterbium. It should be understood that for the sake of simplicity, the term "rare earth" is sometimes used herein as including yttrium. It is preferable to include yttrium as one of the rare earth metal components. In one preferable combination, the film includes an optimal ratio of a first rare earth metal of yttrium to a second rare earth metal of from about 3 to 1 to from about 1.5 to 1 for achieving high critical current densities. It has been found that such films are characterized as having a critical current for the film mixture greater than a critical current for any single rare-earth metal containing superconducting rare-earth-barium-copper oxide layer of about the same thickness alone. The combination of yttrium and europium is especially preferred. Such films of the combination of rare earth metals are generally from about 0.5 micron to about 4 microns in thickness, preferably from about 1 micron to about 4 microns in thickness.

In an another embodiment, various combinations of rare-earth-barium-copper oxides may be used in each of the different layers of a multilayer superconductive structure. The rare earth metals can generally be any suitable rare earth metal from the periodic table, but are preferably chosen from among yttrium, neodymium, samarium, europium, gadolinium, erbium and ytterbium. In a multilayer example, combinations for a first and third layers (with an interlayer of insulating, conducting or superconducting material) may include, for example, both layers of one mixed rare earth oxide combination, or one mixed rare earth oxide combination in the first layer and a different mixed rare earth oxide combination in the third layer. For multilayer composites with more than three layers, the possible mixture combinations would multiply but can readily be worked out by one skilled in the art. Yttrium is a preferred rare earth to include in forming the mixed rare earth oxide combinations.

It has been further found that use of a combination of rare earth metals in forming a superconductive film can in some instances result in the self-assembly of a multilayer structure. Such a structure may achieve some of the benefits of a multilayer structure such as maintenance of high critical current densities when the film thickness exceeds about 1 micron. Use of a mixed target containing both YBCO and EuBCO showed in-situ formation of a multilayer structure following deposition and annealing.

In the high temperature superconducting film of the present invention, the substrate can be, e.g., any polycrystalline material such as a metal or a ceramic such as polycrystalline aluminum oxide or polycrystalline zirconium oxide. Preferably, the substrate can be a polycrystalline metal such as nickel, copper and the like. Alloys including nickel such as various Hastalloy metals are also useful as the substrate as are alloys including copper. The metal substrate on which the superconducting material is eventually deposited should preferably allow for the resultant article to be flexible whereby superconducting articles (e.g., coils, motors or magnets) can be shaped. Other substrates such as rolling assisted biaxially textured substrates (RABiTS) may be used as well.

The measure of current carrying capacity is called "critical current" and is abbreviated as Ic, measured in Amperes and "critical current density" is abbreviated as $J_c$, measured in Amperes per square centimeter.

The present invention is concerned with enhancing the total current carrying capability of a rare earth-BCO film for coated conductors. In one embodiment, the present invention uses a mixture of rare earth barium-copper-oxides to achieve a higher critical current. In another embodiment, the present invention uses multilayer architecture to remove the limitations of a single layer film used in coated conductors where the critical current does not increase linearly with increasing the film thickness.

This invention provides an architecture to enhance the total current carrying capability for a mixed superconducting oxide film. An interlayer, which can be an insulating material, a conducting material, or a superconducting material is used to terminate the growth of defects and to provide a new template for growth of a subsequent superconducting layer, i.e., a subsequent mixed superconducting oxide layer. This process can be repeated as many times as desired or necessary. This multilayer approach provides more surface area where surface pinning may play additional role in enhancing the critical current of the superconducting films. The interlayer materials should be chemically and structurally compatible with the mixed superconducting oxide and can be generally chosen from, e.g., $SrRuO_3$, $CeO_2$, $SrTiO_3$, $Y_2O_3$, YSZ, $LaAlO_3$, and $NdGaO_3$. Preferably, the interlayer material is $SrRuO_3$, $CeO_2$, or $SrTiO_3$ and more preferably, the interlayer material is $CeO_2$. For insulating and conducting materials, the interlayer thickness is generally in the range of about 20 nm to about 200 nm. For superconducting materials as the interlayer, the interlayer thickness is generally in the range of about 20 nm to about 2 microns. The individual layers of mixed superconducting oxide can have a general thickness in the range of about 0.2 $\mu$m to about 2 $\mu$m, more preferably in the range of from about 0.6 $\mu$m to about 2 $\mu$m.

Less structural imperfection can be expected for a mixed superconducting oxide film by using such a design. A multilayer stack consisting of $YBCO/CeO_2/YBCO/CeO_2/YBCO$ has been deposited on a $LaAlO_3$ substrate with a total YBCO thickness of about 1.2 $\mu$m and compared to a single layer YBCO film with the same total film thickness deposited under the same conditions, the $\chi_{min}$ of the multilayer film is less than about 20% in comparison to a value of about 55%. This approach can be applied to films of mixed superconducting oxides as well. This approach can be advantageous for developing mixed superconducting films with a higher or maximum critical current density, whereas the critical current density peaks at a thinner film thickness for single layer films.

Good quality of the top mixed rare earth oxide layer can be obtained by using the present design. The surface resistance of a superconducting film is related to many factors such as surface roughness, Josephson weak-links, and other defects present in the film. By using a multilayer, e.g. $[RE^1RE^2BCO/CeO_2]^n$ (n=1,2,3 ...) structure, it is expected that the surface resistance of a thick mixed rare earth oxide film (about 1.0 to about 1.2 $\mu$m) on a $LaAlO_3$ substrate is comparable to a thinner mixed rare earth oxide film (about 400 nm) on a single crystal YSZ substrate.

Multilayer mixed rare earth oxide thick films on crystal substrate can be achieved by using such a structure. Both an insulating interlayer and a conductive interlayer can be used for such a multilayer scheme.

Multilayer mixed rare earth oxide films can be deposited on polycrystalline Ni-alloy using YSZ deposited by ion beam assisted deposition (IBAD-YSZ) as a template. IBAD-MgO can also be used as a template. A multilayer $RE^1RE^2BCO/CeO_2/RE^1RE^2BCO$ structure can be deposited on, e.g., an IBAD-YSX/Ni-alloy substrate, where the thickness of the $CeO_2$ layer can be in the range of from about 200 to about 250 nm.

The $RE^1RE^2BCO$ layer can be deposited, e.g., by pulsed laser deposition or by methods such as evaporation including coevaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, a solution process and liquid phase epitaxy. Post-deposition anneal processes are necessary with some deposition techniques to obtain the desired superconductivity.

In pulsed laser deposition, powder of the material to be deposited can be initially pressed into a disk or pellet under high pressure, generally above about 1000 pounds per square inch (PSI) and the pressed disk then sintered in an oxygen atmosphere or an oxygen-containing atmosphere at temperatures of about 950° C. for at least about 1 hour, preferably from about 12 to about 24 hours. An apparatus suitable for pulsed laser deposition is shown in Appl. Phys. Lett. 56, 578 (1990), "Effects of Beam Parameters on Excimer Laser Deposition of $YBa_2Cu_3O_{7-\delta}$", such description hereby incorporated by reference.

Suitable conditions for pulsed laser deposition include, e.g., the laser, such as an excimer laser (20 nanoseconds (ns), 248 or 308 nanometers (nm)), targeted upon a rotating pellet of the target material at an incident angle of about 45°. The substrate can be mounted upon a heated holder rotated at about 0.5 rpm to minimize thickness variations in the resultant film or coating, The substrate can be heated during deposition at temperatures from about 600° C. to about 950° C., preferably from about 700° C. to about 850° C. An oxygen atmosphere of from about 0.1 millitorr (mTorr) to about 10 Torr, preferably from about 100 to about 250 mTorr, can be maintained within the deposition chamber during the deposition. Distance between the substrate and the pellet can be from about 4 centimeters (cm) to about 10 cm.

The deposition rate of the film can be varied from about 0.1 angstrom per second (A/s) to about 200 A/s by changing the laser repetition rate from about 0.1 hertz (Hz) to about 200 Hz. Generally, the laser beam can have dimensions of about 1 millimeters (mm) by 4 mm with an average energy density of from about 1 to 4 joules per square centimeter ($J/cm^2$). After deposition, the films generally are cooled within an oxygen atmosphere of greater than about 100 Torr to room temperature.

The present invention is more particularly described in the following examples which are intended as illustrative only, since numerous modifications and variations will be apparent to those skilled in the art.

EXAMPLE 1

Coated-conductor tapes were prepared using Inconel 625 as the base substrate. The tape was polished, and a biaxially-textured layer of yttria-stabilized zirconia (YSZ) was deposited using ion-beam-assisted-deposition (IBAD) with an ion-assist gun as described by U.S. Pat. No 5,872,080, and Foltyn et al., IEEE Trans. Appl. Supercond., vol. 9, pp. 1519–1522, 1999, such descriptions hereby incorporated by reference. Additional layers of YEuBCO and $CeO_2$ of desired thickness were then deposited using pulsed-laser deposition (PLD).

Figure 2:
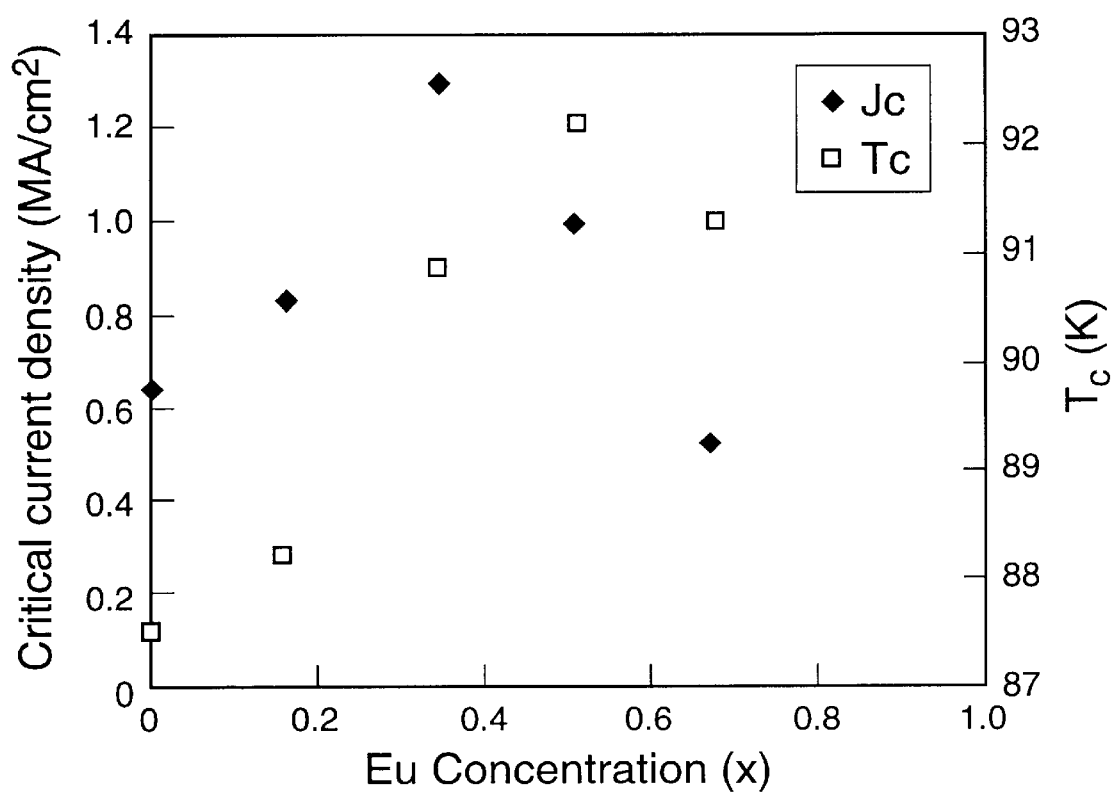
FIG. 2 shows a plot of critical current density of a $Y_{1-x}Eu_xBa_2Cu_3O_{7-\delta}$ layer versus Eu concentration as measured at 75.2 K.
Figure 3A:
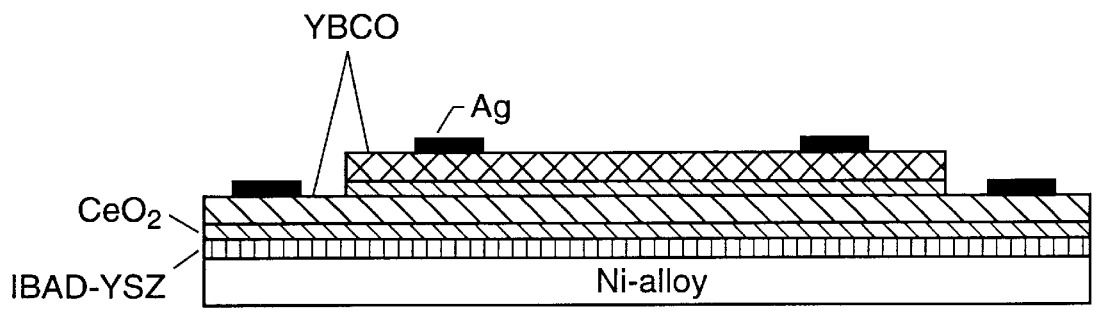
FIGS. 3(a)–(d) show a contact arrangement for measurement of critical current on a multilayer YBCO structure.
Figure 3B:
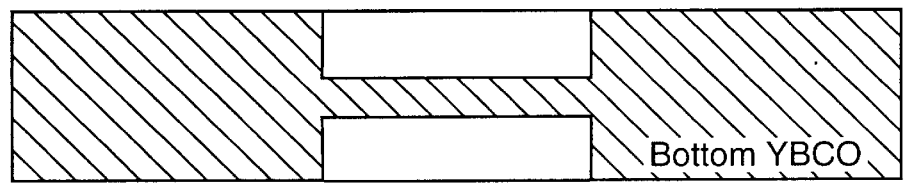
Figure 3C:
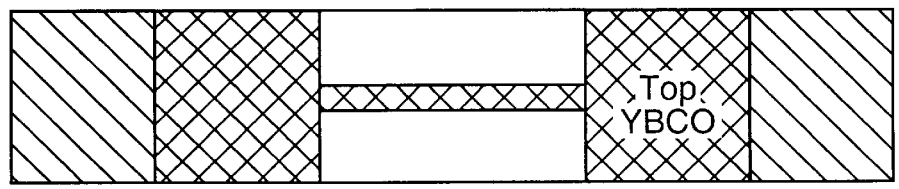
Figure 3D:
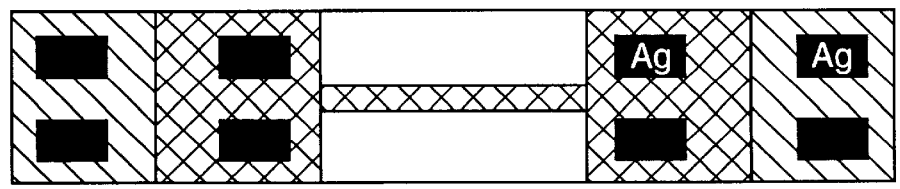

Different Y-Eu samples with varying composition were deposited upon single crystal substrates and critical current densities of the resultant films were measured. The results are shown in FIG. 2 where it can be seen that the compositions including at least some Eu each had a higher critical current density than pure YBCO itself. Peak performance was achieved in the $J_c$ curve at about ⅓ europium to ⅔ yttrium composition.

It was also observed that the superconductive films including the europium and the yttrium had a smoother surface than a yttrium based film. Further, the mixed oxide films provided denser films in comparison to the YBCO films and had fewer misoriented grains of the superconductor. The results of these differences is that thicker films may be grown more reliably thereby increasing the current capacity of the superconductive composite.

EXAMPLE 2

Mixed oxide films including europium and yttrium were prepared as in Example 1. Following deposition under a 200 mT oxygen partial pressure, the subsequent anneal was conducted under pure oxygen. The resultant film exhibited a multilayer structure under examination by TEM. While not wishing to be bound by the present explanation, such a phase segregation is believed to be the result of instabilities in the composition at the higher oxygen partial pressures.

Although the present invention has been described with reference to specific details, it is not intended that such details should be regarded as limitations upon the scope of the invention, except as and to the extent that they are included in the accompanying claims.

What is claimed is:

1. A superconducting structure comprising:
   a substrate;
   a film composed of a mixture of at least two superconducting rare-earth-barium-copper oxides upon said substrate, said film from about 0.5 micron to about 4 microns in thickness and including a ratio of a first rare earth metal to a second rare earth metal is from about 3 to 1 to about 1.5 to 1, said film characterized as having a critical current for said film mixture greater than a critical current for any same single rare-earth metal containing superconducting rare-earth-barium-copper oxide layer of about the same thickness alone.

2. The superconducting structure of claim 1 wherein said rare earth metals are selected from the group consisting of yttrium, neodymium, samarium, europium, gadolinium, erbium and ytterbium.

3. The superconducting structure of claim 1 wherein said first rare-earth metal is yttrium and said second rare-earth is europium.

4. The superconducting structure of claim 1 wherein said first rare earth metal is yttrium.

5. The superconducting structure of claim 4 wherein said ratio of a first rare earth metal of yttrium to a second rare-earth is about 2 to 1.

6. A superconducting structure comprising:

a substrate; and, a film of a superconducting rare-earth-barium-copper oxide upon the substrate, the film comprising a composite multilayer structure of: (i) a first layer of a mixture of superconducting rare-earth-barium-copper oxides from about 0.2 microns to about 2 microns in thickness;

(ii) a layer of an insulating material selected from the group consisting of cerium oxide, strontium titanate, yttrium oxide, magnesium oxide, and yttria-stabilized zirconia, or of a conducting material such as lanthanum strontium cobalt oxide and strontium ruthenium oxide; and, (iii) a second layer of a mixture of superconducting rare-earth-barium-copper oxides from about 0.2 microns to about 2 microns in thickness, the superconducting structure characterized as having a total combined thickness of said first and second superconducting rare-earth-barium-copper oxide layers of at least 2 microns.

7. The superconducting structure of claim 6 wherein said superconducting structure is characterized as having a critical current for the composite multilayer structure greater than a critical current for a single mixed superconducting rare-earth-barium-copper oxide layer of about the same thickness, the single mixed superconducting rare-earth-barium-copper oxide layer including the same rare-earth metals as the composite multilayer structure.

8. The superconducting structure of claim 6 wherein said rare earth metals are selected from the group consisting of yttrium, neodymium, samarium, europium, gadolinium, erbium and ytterbium.

9. The superconducting structure of claim 6 wherein said rare-earth metals are yttrium and europium.

10. The superconducting structure of claim 9 wherein said ratio of yttrium to europium is from about 2 to 1.

* * * * *